United States Patent
Kinyua et al.

(10) Patent No.: US 9,093,998 B2
(45) Date of Patent: Jul. 28, 2015

(54) METHOD AND APPARATUS FOR GENERATING A RAMP SIGNAL

(71) Applicant: Taiwan Semiconductor Manufacturing Co., Ltd., Hsin-Chu (TW)

(72) Inventors: Martin Kinyua, Cedar Park, TX (US); Eric Soenen, Austin, TX (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/943,842

(22) Filed: Jul. 17, 2013

(65) Prior Publication Data

US 2015/0022249 A1    Jan. 22, 2015

(51) Int. Cl.
H03K 4/06    (2006.01)
H03K 4/50    (2006.01)

(52) U.S. Cl.
CPC ........................................ *H03K 4/50* (2013.01)

(58) Field of Classification Search
USPC ................................................ 327/131–140
See application file for complete search history.

(56) References Cited

U.S. PATENT DOCUMENTS

| | | | | |
|---|---|---|---|---|
| 5,187,390 A | * | 2/1993 | Scott, III | 327/91 |
| 5,870,000 A | * | 2/1999 | Matsuda et al. | 331/34 |
| 6,784,725 B1 | * | 8/2004 | Wadhwa et al. | 327/543 |
| 2006/0061412 A1 | * | 3/2006 | Molina et al. | 327/539 |
| 2009/0085617 A1 | * | 4/2009 | Ceballos | 327/131 |
| 2010/0026542 A1 | * | 2/2010 | Wang et al. | 341/155 |
| 2011/0080191 A1 | * | 4/2011 | Patel et al. | 327/105 |

FOREIGN PATENT DOCUMENTS

EP    1635470 A1    3/2006

OTHER PUBLICATIONS

Lim, Y. et al., "A 1.1e Temporal Noise 1/3.2-inch 8Mpixel CMOS Image Sensor using Psuedo-Multiple Sampling", 2010 IEEE International Solid-State Circuits Conference, ISSCC 2010/Session 22/Image Sensors/22.2, pp. 396-398.

(Continued)

*Primary Examiner* — Lincoln Donovan
*Assistant Examiner* — Thomas Skibinski
(74) *Attorney, Agent, or Firm* — Duane Morris LLP (57) ABSTRACT

An apparatus and method for generating a ramp signal includes applying a constant reference voltage to a reference capacitor and controlling charging or discharging of the reference capacitor with a programmable current generator to provide the ramp signal at a ramp signal node. The method can include, buffering the ramp signal to an output node to drive a load. When generating the ramp signal having a negative slope, the programmable current generator includes a programmable current sink coupled to the ramp signal node. When generating the ramp signal having a positive slope, the programmable current generator includes a programmable current source that is coupled between a positive power supply node and the ramp signal node. When generating the ramp signal having a bidirectional slope, the programmable current generator includes a programmable current source and a programmable current sink.

19 Claims, 6 Drawing Sheets

(56) References Cited

OTHER PUBLICATIONS

Yoshihara, S. et al., "A 1/1.8-inch 6.4 MPixel 60 frames/s CMOS Image Sensor With Seamless Mode Change", IEEE Journal of Solid-State Circuits, Dec. 2006, 41(12):2998-3006.

Toyama, T. et al., "A 17.7 MPixel 120fps CMOS Image Sensor with 34.8Gb/s Readout", 2011 IEEE Solid-State Circuit Conference, ISSCC 2011/Session 23/ Image Sensors/ 23.11, pp. 420-422.

* cited by examiner

METHOD AND APPARATUS FOR GENERATING A RAMP SIGNAL

BACKGROUND

Many imaging devices, such as solid state imaging devices including, but not limited to, complementary metal-oxide semiconductor ("CMOS") devices and charge coupled devices ("CCD"), require the implementation of an analog-to-digital converter ("ADC"). The imaging device typically has one or more pixels, such as a two-dimensional array of pixels, where each pixel generates an analog output signal (the "pixel output signal"), the level of which is not known. The pixel output signal is converted, as necessary, into digital data. In a typical imaging device having a pixel array, where the pixel array is a matrix organized in columns and rows, each column has associated therewith a column ADC to convert the pixel output signal then active in that given column to digital data.

As is known in the art, in certain imaging devices the pixel output signal, which may be a voltage signal, is compared with a ramped reference signal, which also may be a voltage signal. During this comparison, a counter operates to keep track of the number of pulses of a clock signal required for the ramped reference signal to become greater than (or less than, depending on the particular implementation) the pixel output signal. From the operation of the counter, a digital data signal can be derived.

Existing implementations of ramp generating circuits used for ADCs are either very complex or create inaccuracies when used with ADCs in real-world applications.

DETAILED DESCRIPTION

With reference to the figures, where like elements have been given like numerical designations to facilitate an understanding of the present subject matter, various embodiments of a system or apparatus and method for generating a ramp voltage signal are described. In order to more fully understand the present subject matter, a brief description of applicable circuitry will be helpful.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

Figure 1:
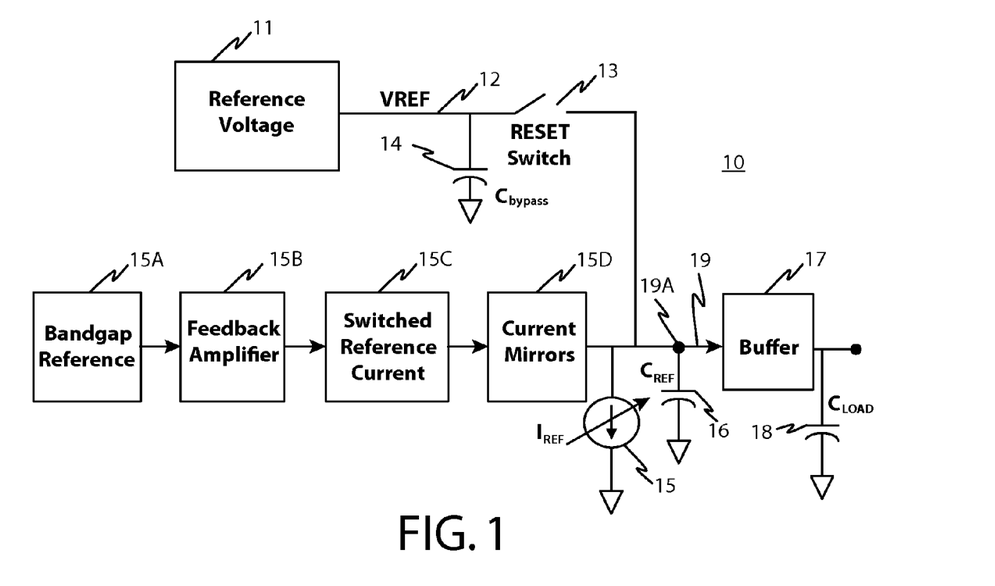
FIG. 1 is a simplified block diagram of a ramp generating circuit according to one embodiment of the present subject matter.

FIG. 1 is a simplified schematic diagram of a ramp generator circuit 10 for generating a voltage ramp signal for an analog to digital converter. In one embodiment, the ramp generator 10 includes a constant reference voltage generator 11 generating a constant reference voltage 12 or "Vref" that is coupled via a reset switch 13 to a node 19A, to which a reference capacitor 16, a programmable current generator (shown as programmable current sink 15), and an output buffer circuit 17 are commonly coupled. The reference capacitor 16 and the programmable current generator 15 are both coupled between node 19A and ground. The output buffer circuit 17 is coupled to ground via an output load such as capacitive load 18. The ramp generator 10 can further include a bandgap reference voltage generator 15A, a feedback amplifier 15B, a switched reference current generator 15C, and one or more current mirrors 15D, which may be considered part of the programmable current sink 15.

Operationally, when a reset switch 13 is closed (on), the reference voltage generator 11 charges the reference capacitor 16 to Vref. When the reset switch 13 is open (off), the reference voltage generator 11 charges a bypass capacitor 14 to Vref, which can typically be 1 volt for example. With the reset switch 13 open, the reference capacitor 16 discharges, thereby providing a voltage ramp signal 19 at a node 19A. The current sink 15 in combination with the reference capacitor 16 controls the slope of the ramp signal (Vramp) 19 at node 19A, helping to improve its linearity. As will be understood by those in the art, the triggering of switch 13 can have a timing relationship to other control signals in the device (e.g., image sensor) with which the ramp generator 10 is used. For example, the switching can be related to pixel RESET readout and SIGNAL readout control signals when implemented as part of an ADC coupled to a CMOS imager.

Figure 2:
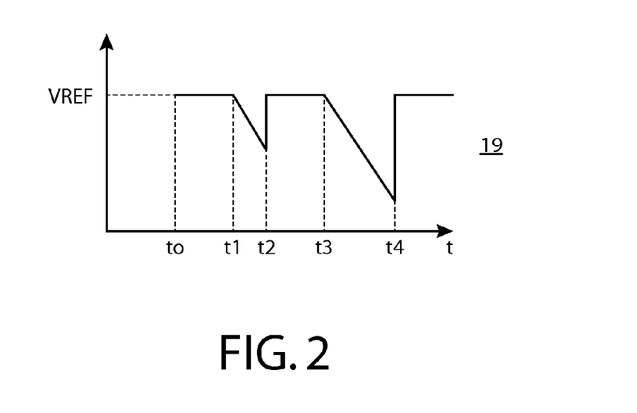
FIG. 2 is a timing diagram of a ramp output voltage according to an embodiment of the present subject matter.

FIG. 2 is a timing diagram of the voltage ramp signal 19 as Vramp charges and discharges. The output buffer circuit 17 buffers the voltage ramp signal 19 to drive the capacitive load 18. Prior to time t0 and through t1, the reset switch 13 is on and the reference capacitor 16 and voltage ramp signal 19 or voltage at node 19A remain at Vref. When the reset switch 13 is turned off from t1 to t2, the programmable current sink 15 discharges the reference capacitor 16, creating the ramp signal seen in FIG. 2 during that interval. When the reset switch 13 is turned on again from time t2 to t3, the voltage reference generator 11 quickly charges reference capacitor 16 back to Vref. When the reset switch 13 is off from time t3 to t4, the programmable current sink 15 once again discharges reference capacitor 16. For a fixed value of reference capacitor 16, the slope of the ramp is controlled by the programmed setting of the programmable current sink 15. That program setting can be set for, for example, different modes of operation of an image sensor. For example, the slope required for obtaining an image at 20 frames/second would be twice that needed for obtaining an image at 10 frames/second.

As explained above, the programmable current generator can be a programmable current sink 15 in the embodiment of ramp generator circuit 10, but can be a programmable current source or a combination of one or more programmable current sinks or current sources in other embodiments.

Figure 3:
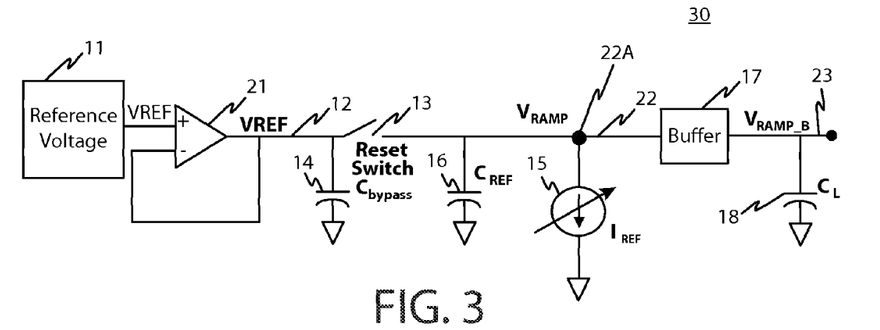
FIG. 3 is a schematic illustration of a ramp generating circuit according to another embodiment of the present subject matter.

FIG. 3 illustrates a schematic diagram of a ramp generator circuit 30. Ramp generator circuit 30 includes many of the same elements as ramp generator circuit 10 of FIG. 1 and operates similarly, but further includes a feedback amplifier 21. An output of the constant reference voltage generator 11 is coupled to a positive input of the feedback amplifier 21, and the output of the feedback amplifier 21 fed back to a negative input thereof. As in the prior embodiment (10), the ramp generator 30 includes a constant reference voltage 12 or "Vref" that is switchably coupled via a reset switch 13 to a reference capacitor 16, a programmable current sink 15, and an output buffer circuit 17 coupled to ground via capacitive load 18. The ramp generator circuit 30 also includes the bypass capacitor 14. The bandgap reference voltage generator 15A, feedback amplifier 15B, reference current source 15C, and one or more current mirrors 15D (not shown) may also be incorporated as part of the programmable current sink 15, as illustrated in FIG. 1 and further discussed with respect to FIG. 4.

Figure 4:
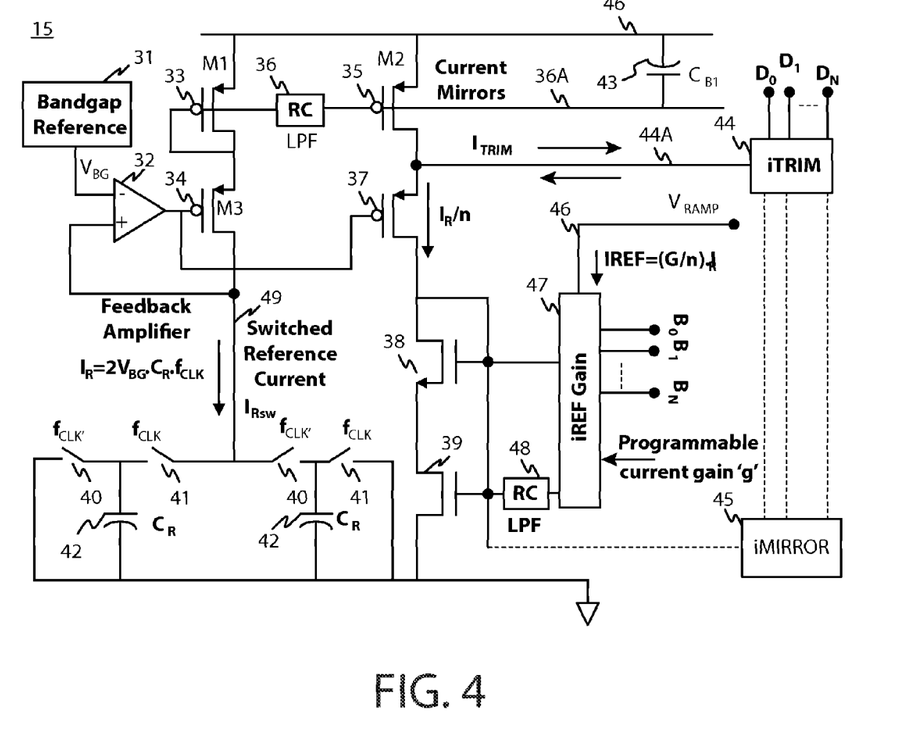
FIG. 4 is a circuit diagram of a programmable current reference in FIG. 3 according to an embodiment of the present subject matter.

FIG. 4 illustrates a more detailed circuit diagram of a programmable current sink 15. The programmable current, shown as switched reference current 49, is generated from a bandgap reference voltage generator 31 and a bandgap reference voltage signal $V_{BG}$. The switched reference current 49 is a switched reference current that is controlled by the switched capacitor (or capacitor network) 42 having switches 41 operating at the frequency or clock speed $f_{clk}$ and switches 40 operating at the frequency or clock speed $f_{clk'}$. The switched reference current 49 is coupled to ground via p-type transistor 33 and p-type transistor 34 via the switched capacitor(s) 42. The gate of the p-type transistor 34 is fed by the output of a feedback amplifier 32. A current mirror, which provides a scaled current $I_R/n$ that is a scaled current of the switch reference current 49 or $I_R$, is formed from p-type transistors 33, 34, 35 and 37. N-type transistors 38 and 39 provide the bias voltages for other current mirrors contained in the IREF Gain circuit 47. A low pass RC filter 36 is coupled between the PMOS transistors 33 and 35 and operates to suppresses transient voltages on a bias line 36A connected to the gate of transistor and 35 to substantially reduce or suppress a ripple on the generated switched reference current 49. The capacitor 43 $C_{B1}$ is an optional capacitor that serves to decouple the voltage ramp signal 46 from the bias line 36A. A Vramp node 46A in FIG. 4 is directly coupled a Vramp node 22A in FIG. 3.

In some embodiments, the programmable current generator 15 includes a trimming circuit 44 ("iTRIM") to generate a bias current $I_{TRIM}$ 44A that depends on a charge and discharge rate for at least one switched capacitor (42). In one embodiment, the iTrim circuit 44 can sink or source current based on bit settings ($D_0, D_1 \ldots D_N$). The programmable current sink 15 further includes a circuit 47 to generate a programmable current gain to adjust a slope of the voltage ramp signal 46 to a desired slope. The gain can be adjusted in one embodiment by adjusting the bit settings $B_0, B_1 \ldots B_N$, for example based on the operating mode of the device. The adjusted bits can be for a 4-bit binary weighted current steering digital-to-analog converter (DAC) that implements gain up to 16 times. A second low pass filter 48 is coupled between the gain circuit 47 and the gates of transistors 38 and 39. This low pass filter 48 operates to further suppress transient voltages in the current mirror. The low pass filter 48 can be a passive low pass filter formed of a cascade of resistive and/or capacitive elements. In some embodiments the programmable current sink 15 includes a current divider circuit 45 or "iMirror" used for scaling the current mirror. In some embodiments, the reference capacitor 16 (see FIGS. 1 and 3) and capacitors 42 in the switched reference current are of the same type and fabricated using the same processing, making the programmable current sink 15, and consequently the voltage ramp generator 10 or 30, less susceptible to variations in process or temperature.

Notably, Vramp is determined from the formula:

$$V_{RAMP} = V_{REF} - \frac{V_{BG} \cdot C_R \cdot 2f_{CLK}}{C_{REF}} \cdot g \cdot t$$

and the switched reference current is determined from the formula $I_R = 2V_{BG} * C_R * f_{CLK}$. In some embodiments, as can be derived from the formulas above, the ramp signal is generated as a linear ramp signal whose slope depends on a ratio of a switched capacitor $C_R$ 42 and the reference capacitor $C_{REF}$ 16. In some embodiments, a linearity of the linear ramp signal also depends on the linearity of the reference capacitor 16 and a reference current 49.

Figure 5:
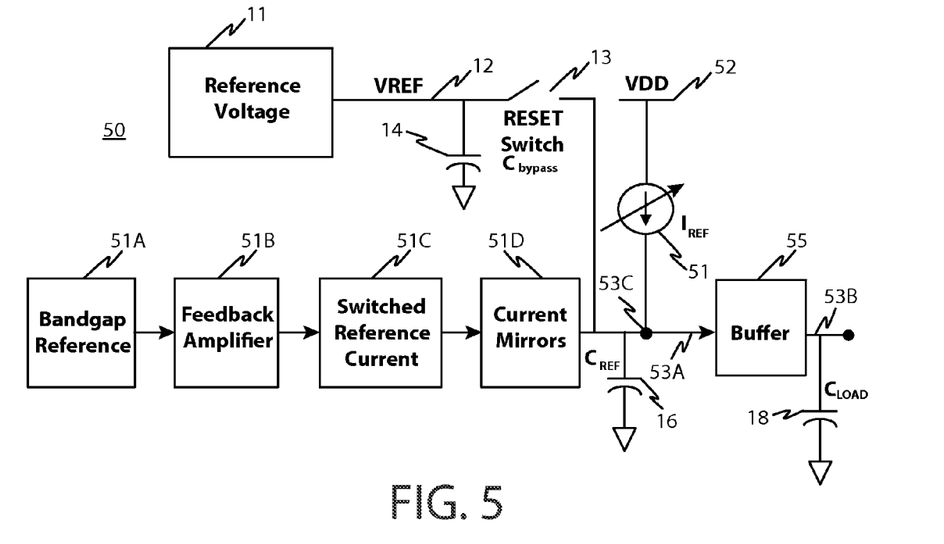
FIG. 5 is a schematic illustration of a ramp generating circuit having a programmable current source according to one embodiment of the present subject matter.

As discussed above, the ramp generator circuits 10 and 30 of FIGS. 1 and 3 generate voltage ramp signals with negative slopes as seen in FIG. 2. FIG. 5 represents an alternative embodiment where of a ramp generator circuit 50 that generates a voltage ramp signal 53A with a positive slope. The ramp generator circuit 50 is similar to the ramp generator 10 of FIG. 1, but includes a programmable current source 51 coupled between a voltage supply 52 (VDD) and ramp signal node 53C rather than a programmable current sink 15. The output buffer circuit 55 is coupled between nodes 53C and 53B and to ground via an output load such as capacitive load 18. As with programmable current sink 15 of FIG. 1, ramp generator 50 can further include a bandgap reference voltage generator 51A, a feedback amplifier 51B, a reference current source 51C, and one or more current mirrors 51D, which can form a part of programmable current source 51. It should be noted that the programmable current generator, whether embodied as a current sink or current source, can remain connected to the ramp voltage node even when the reset switch 13 is closed because reference voltage generator 11 can be considered an ideal source. That is, the reference voltage generator drives the ramp signal node (53C or 19A in FIG. 1) to Vref regardless of whether the reference voltage generator 11 remains connected to the node. Of course, if desired, the programmable current generator can be disconnected (via an appropriate switch) when reset switch 13 is closed.

Figure 5A:
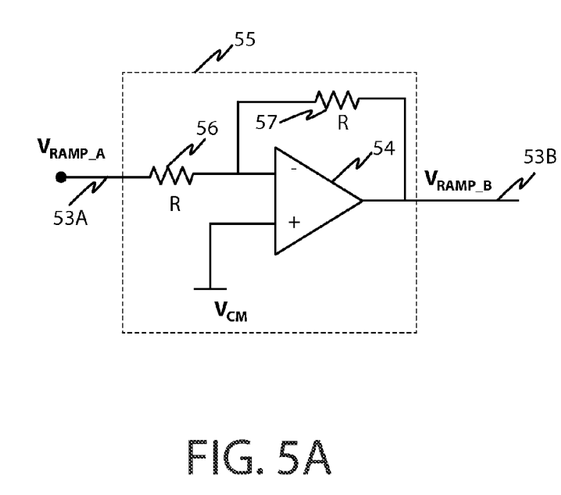
FIG. 5A is a circuit diagram of a buffer circuit in FIG. 5 according to one embodiment of the present subject matter
Figure 6:
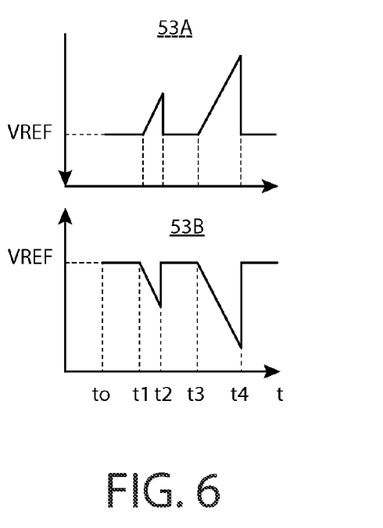
FIG. 6 illustrates timing diagrams of voltage ramp input signals and voltage ramp output signals to the buffer of FIG. 5 or 5A according to one embodiment of the present subject matter.

FIG. 5A illustrates a circuit diagram of the output buffer circuit 55. In one embodiment, the output buffer circuit 55 can be configured to buffer a generated ramp signal 53A to an output node such that an output ramp signal 53B is an inverted replica of the input signal to the output buffer. The buffer circuit 55 can include a resistor 56 coupled to a negative input of the amplifier 54. Another resistor 57 is coupled between the output and the negative input of the amplifier 54. A positive input of the amplifier 54 is coupled to a common mode voltage. As is shown in FIG. 6, the ramp signal 53B is the inversion of the ramp signal 53A.

Prior to time t1, the reset switch 13 is on and the reference capacitor 16 is charged by the constant voltage reference generator 11 to Vref. When the reset switch 13 is turned off from t1 to t2, the programmable current generator 51 charges the reference capacitor, causing the ramp signal to rise from Vref. When the reset switch 13 is turned on again from time t2 to t3, the voltage reference generator 11 drives the voltage ramp signal back down to Vref until the reset switch 13 is turn off again at time t3. When the reset switch 13 is off from time t3 to t4, the programmable current generator 51 once again charges capacitor Vref, causing the voltage ramp signal 53A to rise with a slope controlled by the programmable current generator 51. Further note again that particular slope of the voltage ramp signal in any of the embodiments can be selected for a particular mode of operation for an ADC and CMOS imager. For example, if a faster refresh rate of 20 frames per second in one particular mode is desired, a steeper slope can be set using the programmable current generator. A slower setting of 10 frames/second requires a less steep ramp signal slope.

Figure 7:
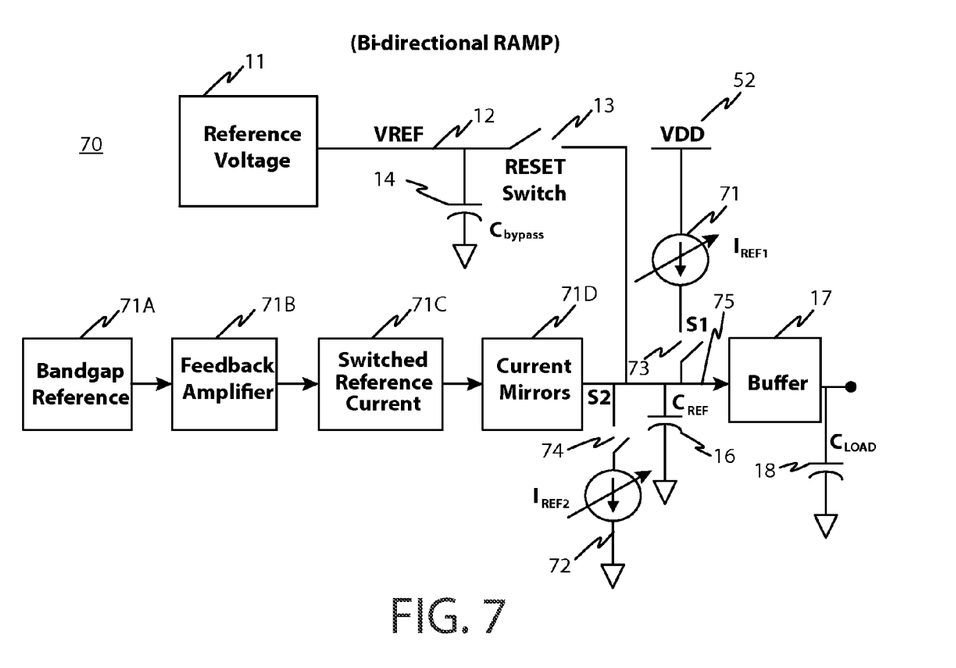
FIG. 7 is a schematic illustration \of a ramp generating circuit having a programmable current source and a programmable current sink according to one embodiment of the present subject matter.
Figure 8:
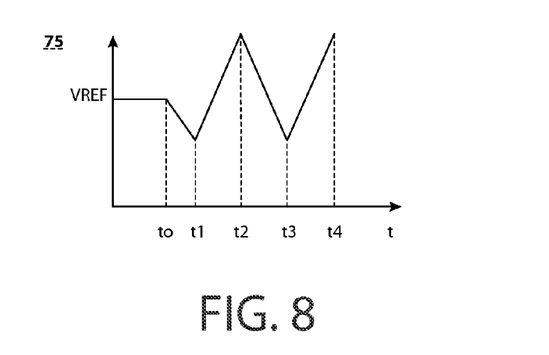
FIG. 8 illustrates a timing diagram of voltage ramp input or output signal to the output buffer of the circuit of FIG. 7 according to one embodiment of the present subject matter.

FIG. 7 represents one example of a ramp generator circuit 70 that generates a voltage ramp signal 75 with a bidirectional slope. The ramp generator circuit 70 is similar to the circuits 10 of FIG. 1 and circuit 50 or FIG. 5, but includes both a programmable current source 71 and a programmable current sink 72 as further explained below. The programmable current source 71 is selectively coupled between the voltage supply 52 and the ramp signal node via a switch 73. The programmable current sink 72 is selectively coupled to the ramp signal node via the switch 74. The output buffer circuit 17 is coupled to ground via an output load such as capacitive load 18. As with programmable current generator 15, the ramp generator 70 can further include a bandgap reference voltage generator 71A, a feedback amplifier 71B, a reference current 71C, and one or more current mirrors 71D as part of the programmable current sink 74 and/or programmable current source 71. As can be seen in the timing diagram of the voltage ramp signal 75 of FIG. 8, the voltage ramp circuit 70 alternatingly couples the programmable current sink 72 (e.g., during intervals t0 to t1, t2 to t3, etc.) and programmable current source (e.g., during intervals t1 to t2, t3 to t4, etc.) to the ramp signal node.

Figure 9:
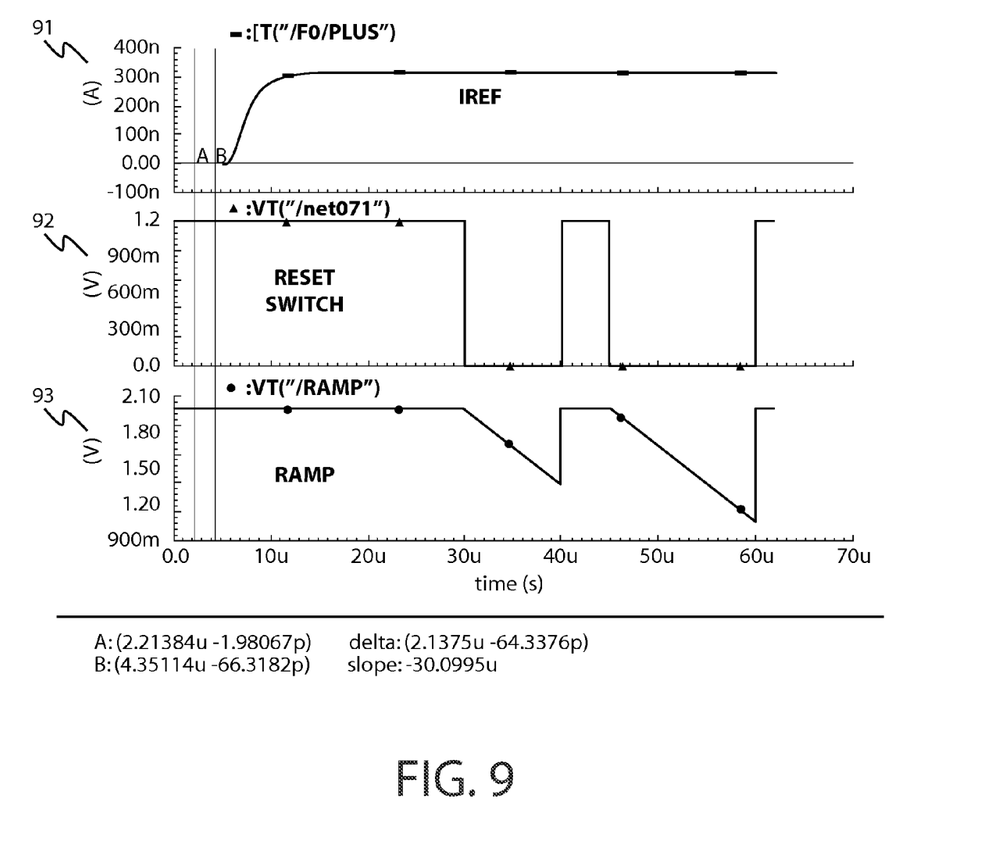
FIG. 9 illustrates timing diagrams of a voltage ramp generating circuit including a current reference source, a reset switch output signal, and a voltage ramp signal according to one embodiment of the present subject matter.

Referring to FIG. 9, FIG. 9 illustrates a simulated timing diagrams for various signals, including a timing diagram 91 for a reference current signal (corresponding to the reference voltage signal), a timing diagram 92 for a reset switch signal, and a timing diagram 93 for a voltage ramp signal. As can be seen, whenever the reset switch signal is turn off (between 30 μs and 40 μs and between 45 μs and 60 μs), the voltage ramp signal 93 decreases linearly until the reset switch signal is again turned on. The voltage ramp signal 93 is smooth without stair steps or other variations.

Figure 10:
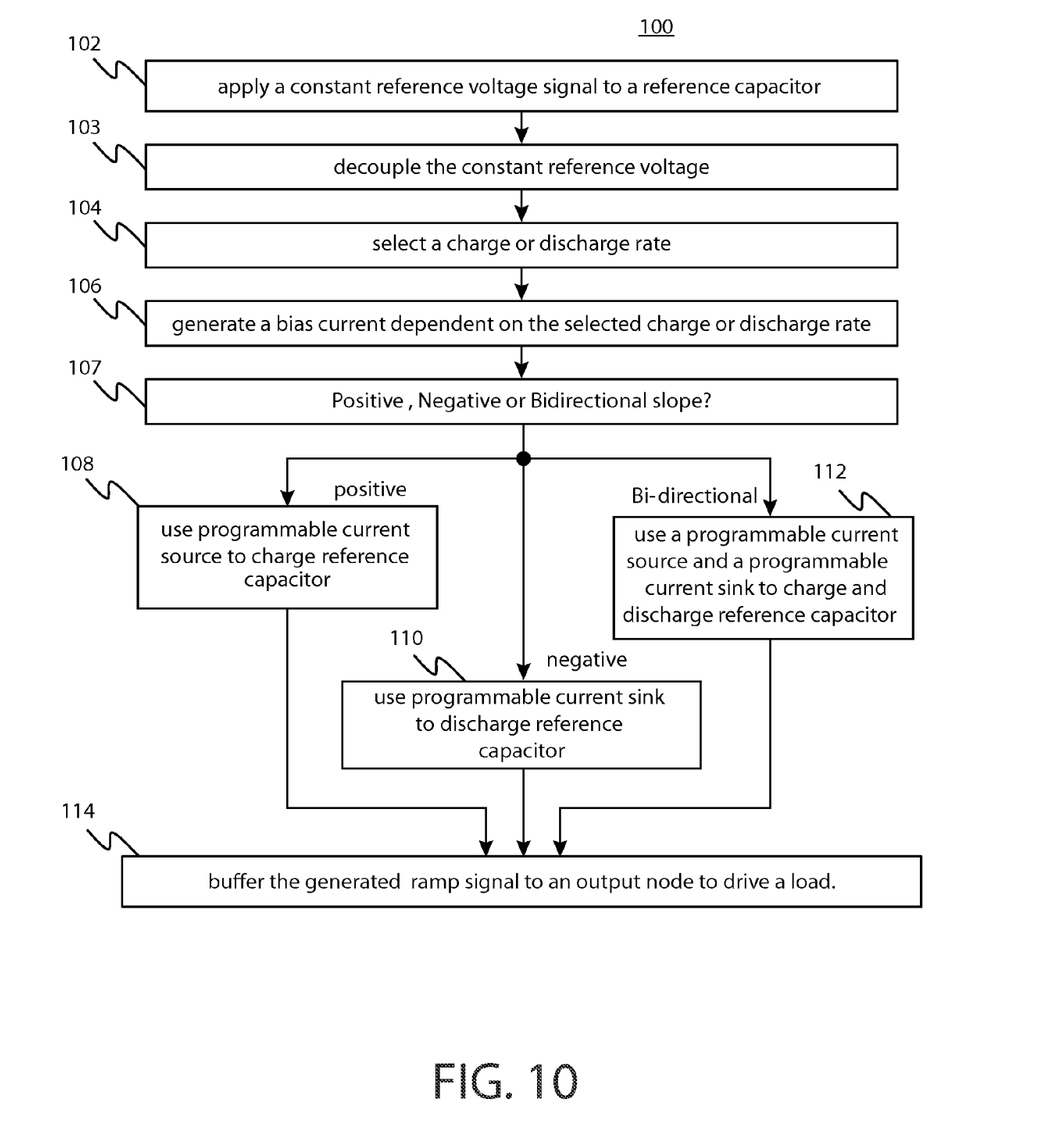
FIG. 10 is a flow diagram of a method for generating a voltage ramp signal according to several embodiments of the present subject matter.

FIG. 10 illustrates a method 100 of generating a ramp signal. The method 100 includes the step 102 of applying a constant reference voltage signal to a reference capacitor at a voltage ramp node. The constant reference voltage signal can be generated from a bandgap reference voltage signal. As explained above, the constant reference voltage generator is an ideal source that drives a voltage ramp node to Vref regardless of whether the reference voltage generator is connected.

At step 103, the constant reference voltage signal is decoupled from the voltage ramp node. After decoupling of the constant reference voltage, a programmable current generator controls the charging or discharging of the reference capacitor.

At step 104, once the constant reference voltage is decoupled from the voltage ramp node, the method 100 controls the charging or discharging of the reference capacitor at the voltage ramp node with a programmable current generator at a selected charge or discharge rate In one embodiment, the selection of the charge or discharge rate or the adjustment of a slope of a ramp signal is controlled by setting a programmable current gain for the programmable current generator. The programmable current generator can come in the form of a programmable current sink, a programmable current source, or a combination of both depending on the profile of the desired voltage ramp signal.

In some embodiments at step 106, the method includes generating a bias current dependent on a charge and discharge rate for a at least one switched capacitor. The method can further include any number of additional steps or less steps or steps in an order shown differently from the steps shown in the examples herein. For example, the method can include applying a low pass filter to suppress transient voltages on a bias line connected to a gate of one or more transistor devices of the programmable current (not shown).

At step 107, a determination is made whether a ramp signal with a positive slope, a negative slope, or a bidirectional slope is desired.

At step 108, if the generated ramp signal has a positive slope, then the method 100 uses a programmable current source to charge the reference capacitor. At step 110, if the generated ramp signal is to have a negative slope, then the method 100 uses a programmable current sink to discharge reference capacitor. At step 112, if the generated ramp signal is to have a bidirectional slope, then the method 100 alternatingly charges and discharges the reference capacitor using a programmable current source and programmable current sink.

At step 114, the method buffers the generated ramp signal to an output node to drive a load.

In some embodiments, the method further includes generating a current to trim a value of a reference current using digital control bits. In yet another embodiment, the method can include buffering the generated ramp signal to an output node to drive a load such that the buffering step inverts the ramp signal to the output node. In some embodiments, the slope of the ramp signal is dependent on a ratio of a switched capacitor in the programmable current generator and the reference capacitor. In some embodiments, a linearity of the linear ramp signal depends on the linearity of the reference capacitor and a reference current of the programmable current generator.

In some embodiments, a method of generating a ramp signal includes applying a constant reference voltage to a reference capacitor and after applying the constant reference voltage, controlling charging or discharging of the reference capacitor at a ramp signal node with a programmable current generator to provide the ramp signal at the ramp signal node. In some embodiments, the method includes generating a bias current dependent on a charge and discharge rate for at least one switched capacitor or low pass filtering a bias line signal to suppress transient voltages on a bias line connected to a gate of transistor devices of the programmable generator or generating a programmable current gain to adjust a slope of the ramp signal. In some embodiments, the method includes buffering the ramp signal to an output node to drive a load where the programmable current generator controls a slope of the ramp signal at the ramp signal node. In some embodiments, the method further includes generating a current to trim a value of a reference current of the programmable current generator using digital control bits. In one embodiment when generating the ramp signal having a negative slope, the programmable current generator includes a programmable current sink. In another embodiment, when generating the ramp signal having a positive slope, the programmable current source includes a programmable current that is coupled between a power supply node and an output buffer. In one embodiment, the method includes buffering the ramp signal to an output node to drive a load and where the buffering inverts the generated ramp signal to the output node.

In some embodiments, the ramp signal has a bidirectional slope and the programmable current generator includes a programmable current sink and a programmable current source, the method including connecting the programmable current source between a power supply node and a output buffer and further connecting the programmable current sink in parallel with the reference capacitor. In some embodiments, the method includes generating the ramp signal as a linear ramp signal whose slope depends on a ratio of a switched capacitor in the programmable current generator and the reference capacitor. In some embodiments, a linearity of the linear ramp signal depends on the linearity of the reference capacitor and a reference current.

In some embodiments, a ramp generator circuit for generating a voltage ramp signal for an analog to digital converter includes a reference capacitor coupled to a ramp signal node, a constant reference voltage generator generating a constant reference voltage signal switchably coupled to the ramp signal node. The ramp generator circuit further includes a programmable current generator coupled to the ramp signal node for charging or discharging the reference capacitor while the constant reference voltage generator is decoupled from the ramp signal node. In some embodiments, the ramp generator circuit includes a circuit to generate a bias current that depends on a charge and discharge rate for at least one switched capacitor of the programmable current generator or a low pass filter to suppress transient voltages on a bias line connected to one or more gates of transistor devices of the programmable current generator. In some embodiments, the ramp generator circuit includes a buffer circuit for buffering the voltage ramp signal and coupling the voltage ramp signal to an output node to drive a load. In some embodiments the programmable current generator includes the bandgap reference voltage source coupled to a feedback amplifier, a switched reference current, and a current mirror. In some embodiments, the reference capacitor and capacitors in the switched reference current are made of the same materials using the same processing.

In some embodiments, when generating the voltage ramp signal with a negative slope, the ramp generator circuit includes selectively couples the constant reference voltage source the reference capacitor, and the programmable current generator is a programmable current sink. In some embodiments, when generating the voltage ramp signal with a positive slope, the ramp generator circuit couples the constant reference voltage to the reference capacitor and the buffer circuit, and the programmable current generator is a programmable current source coupled between a power supply node and an output buffer. In yet some other embodiments when generating the voltage ramp signal with a bi-directional slope, the programmable current generator includes a programmable current source and a programmable current sink, wherein the ramp generator circuit selectively couples the programmable current source between a power supply node and a output buffer and further selectively couples the programmable current sink in parallel with the reference capacitor.

In some embodiments, a ramp generator circuit for generating a voltage ramp signal for an analog to digital converter includes a constant reference voltage source generating a constant reference voltage at a first node, a bypass capacitor coupled to the first node, a reference capacitor coupled to a voltage ramp signal node, and a switch for coupling and decoupling the first node to the ramp signal node. The ramp generator circuit further includes a programmable current generator connected to the voltage ramp node to control a slope of the voltage ramp signal at the voltage ramp signal node, the programmable current generator providing a programmable current generated from a bandgap reference voltage source, and further includes an output buffer circuit coupling the voltage ramp signal node to an output node. In some embodiments, the programmable current generator generates a linear ramp signal having one of a positive slope, a negative slope or a bi-directional slope.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Embodiments can include, but are not limited to any bi-directional generator circuit having a positive, negative, or bi-directional slope used with an ADC or otherwise.

Furthermore, all examples and conditional language recited herein are principally intended expressly to be only for pedagogical purposes and to aid in understanding the principles of the disclosure and the concepts contributed by the inventors to furthering the art, and are to be construed as being without limitation to such specifically recited examples and conditions. Moreover, all statements herein reciting principles, aspects, and embodiments, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

Although the disclosure has been described in terms of exemplary embodiments, it is not limited thereto. Rather, the appended claims should be construed broadly, to include other variants and embodiments, which can be made by those skilled in the art without departing from the scope and range of equivalents.

We claim:

1. A method of generating a ramp signal, comprising:
   applying a constant reference voltage to a reference capacitor; and
   after the applying step, controlling charging or discharging of the reference capacitor with a programmable current generator to provide the ramp signal at a ramp signal node, wherein controlling charging or discharging of the reference capacitor with the programmable current generator includes:

generating a bias current in response to a first set of bit settings of a trimming circuit of the programmable current generator, and adjusting a gain of the bias current in response to digital inputs received at a gain circuit of the programmable current generator.

2. The method of claim 1, wherein the bias current is dependent on a selected charge or discharge rate.

3. The method of claim 1, further comprising low pass filtering within the programmable current generator the bias current coupled to the ramp signal node to suppress transient signals of the bias current.

4. The method of claim 1, further comprising buffering the ramp signal to an output node to drive a load.

5. The method of claim 1, wherein the ramp signal has a negative slope and the programmable current generator includes a programmable current sink coupled to the ramp signal node.

6. The method of claim 1, wherein the ramp signal has a positive slope and wherein the programmable current generator includes a programmable current source that is coupled between a positive power supply node and the ramp signal node.

7. The method of claim 6, further comprising buffering the ramp signal to an output node to drive a load, wherein the buffering step inverts the ramp signal to the output node.

8. The method of claim 1, wherein the ramp signal has a bidirectional slope and wherein the programmable current generator includes a programmable current sink and a programmable current source, the method including alternatingly coupling the programmable current source and programmable current sink to the ramp signal node.

9. The method of claim 1, wherein a slope of the ramp signal is dependent on a ratio of a switched capacitor in the programmable current generator and the reference capacitor.

10. The method of claim 9, wherein a linearity of the linear ramp signal depends on the linearity of the reference capacitor and a reference current.

11. A ramp generator for generating a voltage ramp signal for an analog to digital converter, comprising:

a reference capacitor coupled to a ramp signal node;

a constant reference voltage generator generating a constant reference voltage signal switchably coupled to the ramp signal node; and a programmable current generator coupled to the ramp signal node for charging or discharging the reference capacitor while the reference voltage generator is decoupled from the ramp signal node, wherein the programmable current generator includes:

a trimming circuit configured to generate a bias current based on a first set of bit settings, and a gain block configured to adjust a gain of the bias current in response to receiving digital input signals.

12. The ramp generator of claim 11, wherein the bias current is dependent on a selected charge or discharge rate.

13. The ramp generator circuit of claim 11, wherein the programmable current generator includes a low pass filter configured to suppress transient signals of the bias current.

14. The ramp generator circuit of claim 11, further comprising a buffer circuit for buffering the voltage ramp signal to an output node to drive a load.

15. The ramp generator circuit of claim 11, wherein the programmable current generator comprises a bandgap reference voltage source coupled to a feedback amplifier, a switched reference current generator, and the at least one current mirror.

16. The ramp generator circuit of claim 15, wherein the reference capacitor and capacitors in the switched reference current generator are of the same type.

17. The ramp generator circuit of claim 11, wherein the programmable current generator includes one or both of a programmable current sink coupled between a low power supply node and the ramp signal node and a programmable current source coupled between a high power supply node and the ramp signal node.

18. A ramp generator circuit for generating a voltage ramp signal for an analog to digital converter, comprising:

a constant reference voltage source generating a constant reference voltage at a first node;

a bypass capacitor coupled to the first node;

a reference capacitor coupled to a voltage ramp signal node;

a switch for coupling and decoupling the first node to the ramp signal node;

a programmable current generator connected to the voltage ramp node to control a slope of the voltage ramp signal at the voltage ramp signal node, the programmable current generator providing a programmable current generated from a bandgap reference voltage source, the programmable current generator including:

a trimming circuit configured to generate a bias current based on a first set of bit settings, and a gain block configured to adjust a gain of the bias current in response to receiving digital input signals; and an output buffer circuit coupling the voltage ramp signal node to an output node, wherein the voltage ramp signal is configured to drive a load.

19. The ramp generator circuit of claim 18, wherein the programmable current generator is configured to generate a linear ramp signal having one of a positive slope, a negative slope or a bi-directional slope.

* * * * *